United States Patent
Adrian et al.

(10) Patent No.: US 10,537,035 B2
(45) Date of Patent: Jan. 14, 2020

(54) APPARATUS, SYSTEM, AND METHOD FOR SECURING HARD DRIVES IN A STORAGE CHASSIS

(71) Applicant: Facebook, Inc., Menlo Park, CA (US)

(72) Inventors: Jason David Adrian, San Jose, CA (US); Chuankeat Kho, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/697,405

(22) Filed: Sep. 6, 2017

(65) Prior Publication Data
US 2019/0075668 A1    Mar. 7, 2019

(51) Int. Cl.
| H05K 5/02 | (2006.01) |
| H05K 5/00 | (2006.01) |
| G11B 5/48 | (2006.01) |
| G11B 33/12 | (2006.01) |

(52) U.S. Cl.
CPC ......... *H05K 5/0221* (2013.01); *G11B 5/4806* (2013.01); *G11B 33/124* (2013.01); *G11B 33/128* (2013.01); *H05K 5/0008* (2013.01); *H05K 5/0021* (2013.01); *H05K 5/0226* (2013.01); *H05K 5/0239* (2013.01)

(58) Field of Classification Search
CPC .. H05K 5/0221; H05K 5/0226; H05K 5/0008; H05K 5/0021; H05K 5/0239; G11B 5/4806
USPC .................................................... 361/679.39
See application file for complete search history.

(56) References Cited

U.S. PATENT DOCUMENTS

| 3,601,463 | A |   | 8/1971  | Watt |
| 3,996,500 | A |   | 12/1976 | Coules |
| D294,800  | S |   | 3/1988  | Nilsson |
| 4,969,065 | A |   | 11/1990 | Petri |
| 5,262,705 | A |   | 11/1993 | Hattori |
| 5,281,149 | A |   | 1/1994  | Petri |
| 5,724,803 | A |   | 3/1998  | Pea |
| 5,793,614 | A | * | 8/1998  | Tollbom ............... H05K 7/1409 361/725 |
| 5,957,659 | A |   | 9/1999  | Amou et al. |
| 6,021,044 | A |   | 2/2000  | Neville, Jr. et al. |
| 6,109,767 | A |   | 8/2000  | Rodriguez |
| 6,116,375 | A |   | 9/2000  | Lorch et al. |
| 6,159,031 | A |   | 12/2000 | Llapitan et al. |

(Continued)

OTHER PUBLICATIONS

Jason David Adrian et al.; Apparatus, System, and Method for Reconfigurable Media-Agnostic Storage; U.S. Appl. No. 15/694,068, filed Sep. 1, 2017.

(Continued)

*Primary Examiner* — Rockshana D Chowdhury
(74) *Attorney, Agent, or Firm* — FisherBroyles, LLP

(57) ABSTRACT

A drive latch apparatus may include a latch coupled to a chassis such that the latch secures a hard drive to the chassis. The apparatus may also include a handle coupled to a proximal end of the latch such that compressing the handle unlocks the latch from the chassis. In addition, the apparatus may include a drive holder coupled to a distal end of the latch such that a distal end of the drive holder bends under the hard drive to unseat the hard drive and the drive holder slides vertically from the chassis in tandem with the latch. Various other apparatuses, systems, and methods are also disclosed.

15 Claims, 8 Drawing Sheets

(56) References Cited

U.S. PATENT DOCUMENTS

| | | | |
|---|---|---|---|
| 6,181,549 B1 | 1/2001 | Mills et al. | |
| 6,331,915 B1 | 12/2001 | Myers | |
| 6,385,051 B1 | 5/2002 | Perez et al. | |
| 6,404,646 B1 | 6/2002 | Tsai et al. | |
| 6,469,899 B2 | 10/2002 | Hastings et al. | |
| 6,515,854 B1 | 2/2003 | Claprood | |
| 6,552,915 B2 | 4/2003 | Takahashi et al. | |
| 6,621,692 B1 | 9/2003 | Johnson et al. | |
| 6,695,629 B1 | 2/2004 | Mayer | |
| 6,791,843 B1 | 9/2004 | Dobbs et al. | |
| 6,798,669 B1 | 9/2004 | Hsu | |
| 6,813,165 B2 | 11/2004 | Cheng et al. | |
| 6,987,674 B2 | 1/2006 | El-Batal et al. | |
| 6,995,982 B2 | 2/2006 | Gonzalez et al. | |
| 7,004,764 B2 | 2/2006 | Boudreau et al. | |
| 7,084,654 B2 | 8/2006 | Zhao et al. | |
| 7,088,579 B1 | 8/2006 | Konshak | |
| 7,167,371 B2 * | 1/2007 | Coles | H05K 7/1409 312/223.1 |
| 7,301,778 B1 | 11/2007 | Fang | |
| 7,304,855 B1 | 12/2007 | Milligan et al. | |
| 7,411,787 B2 | 8/2008 | Katakura et al. | |
| 7,423,354 B2 | 9/2008 | Suzuki et al. | |
| 7,505,286 B2 | 3/2009 | Brovald et al. | |
| 7,515,413 B1 | 4/2009 | Curtis | |
| 7,649,750 B2 | 1/2010 | Lee | |
| 8,020,902 B1 | 9/2011 | Li | |
| 8,127,059 B1 | 2/2012 | Carr et al. | |
| 8,203,851 B2 | 6/2012 | Boetzer | |
| 8,310,828 B2 * | 11/2012 | Collins | G11B 33/08 29/603.03 |
| 8,331,095 B2 | 12/2012 | Hu et al. | |
| 8,369,080 B2 * | 2/2013 | Huang | G06F 1/187 361/679.37 |
| 8,517,054 B2 | 8/2013 | Lai et al. | |
| 8,570,720 B2 | 10/2013 | Yao et al. | |
| 8,636,528 B2 * | 1/2014 | Sass | H01R 12/7029 439/157 |
| 8,657,619 B2 | 2/2014 | Lin et al. | |
| 8,743,549 B2 | 6/2014 | Frink et al. | |
| 8,749,966 B1 * | 6/2014 | Boudreau | G06F 1/187 361/679.33 |
| 8,848,349 B2 | 9/2014 | Ke | |
| 8,944,538 B2 | 2/2015 | Li | |
| 8,971,052 B2 | 3/2015 | Fu | |
| 9,066,438 B2 | 6/2015 | Chen | |
| 9,070,419 B1 | 6/2015 | Zhu et al. | |
| 9,098,233 B2 | 8/2015 | Keffeler | |
| 9,101,210 B2 | 8/2015 | Lin | |
| 9,203,188 B1 | 12/2015 | Siechen et al. | |
| 9,274,548 B2 | 3/2016 | Foisy et al. | |
| 9,298,230 B2 | 3/2016 | Wei | |
| 9,313,909 B1 * | 4/2016 | Huang | G11B 33/128 |
| 9,354,003 B2 | 5/2016 | Lin | |
| 9,448,601 B1 | 9/2016 | Beall et al. | |
| 9,454,190 B2 * | 9/2016 | Mao | H05K 7/1487 |
| 9,456,519 B2 | 9/2016 | Bailey et al. | |
| 9,461,389 B2 | 10/2016 | Novack et al. | |
| 9,538,684 B2 | 1/2017 | Chen et al. | |
| 9,545,028 B2 | 1/2017 | Hoshino et al. | |
| 9,572,276 B2 | 2/2017 | Haroun | |
| 9,583,877 B1 | 2/2017 | Angelucci | |
| 9,609,778 B1 | 3/2017 | Spencer et al. | |
| 9,763,350 B2 | 9/2017 | Rust et al. | |
| 9,763,353 B1 * | 9/2017 | Beall | H05K 7/1488 |
| 9,795,052 B2 | 10/2017 | Hsiao et al. | |
| 9,936,611 B1 | 4/2018 | Beall et al. | |
| 9,949,407 B1 | 4/2018 | Beall | |
| 10,058,006 B2 * | 8/2018 | Hung | H05K 7/18 |
| 10,165,703 B1 | 12/2018 | Adrian | |
| 10,178,791 B1 | 1/2019 | Kho | |
| 10,240,615 B1 | 3/2019 | Kho et al. | |
| 10,264,698 B2 | 4/2019 | Kho et al. | |
| 10,372,360 B2 | 8/2019 | Adrian | |
| 2003/0123221 A1 | 7/2003 | Liao | |
| 2003/0183448 A1 | 10/2003 | Sleet et al. | |
| 2003/0200472 A1 | 10/2003 | Midorikawa et al. | |
| 2003/0200475 A1 | 10/2003 | Komoto | |
| 2005/0057909 A1 | 3/2005 | El-Batal et al. | |
| 2005/0136747 A1 | 6/2005 | Caveney et al. | |
| 2005/0182874 A1 | 8/2005 | Herz et al. | |
| 2005/0238421 A1 | 10/2005 | Doerr et al. | |
| 2006/0075155 A1 | 4/2006 | Fuller et al. | |
| 2006/0134953 A1 | 6/2006 | Williams et al. | |
| 2006/0146507 A1 | 7/2006 | Lee | |
| 2006/0274508 A1 | 12/2006 | LaRiviere et al. | |
| 2007/0195542 A1 | 8/2007 | Metros et al. | |
| 2007/0230111 A1 | 10/2007 | Starr et al. | |
| 2007/0233781 A1 | 10/2007 | Starr et al. | |
| 2007/0234081 A1 | 10/2007 | Makino et al. | |
| 2008/0007913 A1 | 1/2008 | Sullivan et al. | |
| 2008/0117569 A1 | 5/2008 | Lee | |
| 2008/0195786 A1 | 8/2008 | Lee | |
| 2008/0264192 A1 | 10/2008 | Christensen | |
| 2009/0245745 A1 | 10/2009 | Krampotich et al. | |
| 2009/0271950 A1 | 11/2009 | Wang | |
| 2009/0274429 A1 | 11/2009 | Krampotich et al. | |
| 2009/0310303 A1 | 12/2009 | Najbert | |
| 2010/0195304 A1 | 8/2010 | Takao | |
| 2010/0296791 A1 | 11/2010 | Makrides-Saravanos et al. | |
| 2011/0208937 A1 | 8/2011 | Hayashi et al. | |
| 2011/0273850 A1 | 11/2011 | Chen | |
| 2011/0299237 A1 * | 12/2011 | Liang | G11B 33/128 361/679.38 |
| 2011/0309730 A1 | 12/2011 | Retchloff et al. | |
| 2012/0004772 A1 | 1/2012 | Rahilly et al. | |
| 2012/0020006 A1 | 1/2012 | Xu et al. | |
| 2012/0134086 A1 | 5/2012 | Zhang | |
| 2012/0230815 A1 | 9/2012 | Teramoto et al. | |
| 2012/0257360 A1 | 10/2012 | Sun | |
| 2012/0305745 A1 | 12/2012 | Chen et al. | |
| 2012/0320519 A1 | 12/2012 | Wu et al. | |
| 2013/0050955 A1 | 2/2013 | Shinsato et al. | |
| 2013/0058054 A1 | 3/2013 | Zhou | |
| 2013/0258580 A1 | 10/2013 | Nakayama | |
| 2013/0325183 A1 | 12/2013 | Rahilly | |
| 2014/0111930 A1 | 4/2014 | Henderson | |
| 2014/0118936 A1 | 5/2014 | Merlet et al. | |
| 2014/0187068 A1 | 7/2014 | Chia et al. | |
| 2014/0191636 A1 | 7/2014 | Li | |
| 2014/0369002 A1 | 12/2014 | Takeuchi et al. | |
| 2015/0156912 A1 | 6/2015 | Liang et al. | |
| 2015/0163946 A1 | 6/2015 | Kyle et al. | |
| 2015/0208548 A1 | 7/2015 | Chu et al. | |
| 2015/0235673 A1 | 8/2015 | Lo | |
| 2015/0380059 A1 | 12/2015 | Bell et al. | |
| 2016/0018859 A1 * | 1/2016 | Mao | H05K 7/1487 361/679.58 |
| 2016/0042768 A1 * | 2/2016 | Yang | G11B 33/128 403/322.4 |
| 2016/0150659 A1 | 5/2016 | Chen et al. | |
| 2016/0150667 A1 | 5/2016 | Xu et al. | |
| 2016/0330858 A1 | 11/2016 | Ehlen | |
| 2017/0325361 A1 | 11/2017 | Chen et al. | |
| 2018/0168071 A1 | 6/2018 | Edge et al. | |
| 2018/0260349 A1 | 9/2018 | Mondal et al. | |
| 2019/0069432 A1 | 2/2019 | Kho et al. | |
| 2019/0069437 A1 | 2/2019 | Adrian et al. | |
| 2019/0069440 A1 | 2/2019 | Adrian | |
| 2019/0073008 A1 | 3/2019 | Adrian | |
| 2019/0079565 A1 | 3/2019 | Adrian | |
| 2019/0090374 A1 | 3/2019 | Kho et al. | |
| 2019/0090376 A1 | 3/2019 | Kho et al. | |
| 2019/0098795 A1 | 3/2019 | Adrian | |

OTHER PUBLICATIONS

Jason David Adrian; Apparatus, System, and Method for Indicating the Status of and Securing Hard Drives; U.S. Appl. No. 15/700,112, filed Sep. 9, 2017.

(56) References Cited

OTHER PUBLICATIONS

Jason David Adrian; Apparatus, System, and Method for Directing Air in a Storage-System Chassis; U.S. Appl. No. 15/689,650, filed Aug. 29, 2017.

Jason David Adrian et al.; Apparatus, System, and Method for Enabling Multiple Storage-System Configurations; U.S. Appl. No. 15/688,830, filed Aug. 28, 2017.

Jason David Adrian; Apparatus, System, and Method for Detecting Device Types of Storage Devices; U.S. Appl. No. 15/698,540, filed Sep. 7, 2017.

Chuankeat Kho et al.; Removeable Drive-Plane Apparatus, System, and Method; U.S. Appl. No. 15/693,362, filed Aug. 31, 2017.

Chuankeat Kho et al.; Systems and Methods for Mounting Assembly Pull-Handles; U.S. Appl. No. 15/687,406, filed Aug. 25, 2017.

Jason David Adrian; An Apparatus, System, and Method for Reconfiguring Air Flow Through a Chassis; U.S. Appl. No. 15/716,251, filed Sep. 26, 2017.

Jason Adrian; Introducing Bryce Canyon: Our next-generation storage platform; https://code.facebook.com/posts/1869788206569924/introducing-bryce-canyon-our-next-generation-storage-platform/; Mar. 8, 2017.

Jason Adrian et al.; Bryce Canyon Storage Specification; Mar. 31, 2017.

Open Compute Project; http://opencompute.org/; as accessed Sep. 29, 2017.

Jason David Adrian; Data-Center Drawer and Cable Track Assembly; U.S. Appl. No. 15/720,647, filed Sep. 29, 2017.

Bisson; How Facebook Does Storage; https://thenewstack.io/facebook-storage.

What's the Difference Between SATA and SAS Hard Drives?; https://www.pickaweb.co.uk/kb/difference-between-sata-sas-hard-drives/.

Chuankeat Kho; Apparatus, System, and Method for Securing Computing Components to Printed Circuit Boards; U.S. Appl. No. 15/713,607, filed Sep. 23, 2017.

Chuankeat Kho et al.; Apparatus, System, and Method for Partitioning a Storage-System Chassis; U.S. Appl. No. 15/708,069, filed Sep. 18, 2017.

Chuankeat Kho et al.; Apparatus, System, and Method for Dampening Vibrations Generated by Exhaust Fans; U.S. Appl. No. 15/713,609, filed Sep. 23, 2017.

Chuankeat Kho et al.; Apparatus, System, and Method for Resisting Shock to a Data-Center Rack; U.S. Appl. No. 15/708,075, filed Sep. 18, 2017.

Acoustic Attenuation; https://en.wikipedia.org/wiki/Acoustic_attenuation; Oct. 22, 2012.

Electromagnetic Shielding; https://en.wikipedia.org/wiki/Electromagnetic_shielding; May 15, 2016.

\* cited by examiner

APPARATUS, SYSTEM, AND METHOD FOR SECURING HARD DRIVES IN A STORAGE CHASSIS

BACKGROUND

Large data centers may have rooms that contain multiple specialized racks to hold various types of computing equipment. In addition, each of these racks may hold multiple pieces of computing hardware that provide storage and computing power for organizations or individuals. For example, a data center may contain racks of hard drives and servers that process data and transmit information over a network. Over time, these pieces of hardware may require maintenance and may eventually need to be replaced.

Traditionally, equipment such as hard drives may be installed in a carrier and then transferred to a drawer in a data-center rack. Installing and removing computing equipment may also require specialized tools for mounting or dismounting. For example, when a hard drive failure is detected, a technician may need to use tools to remove the carrier containing the hard drive and then use additional tools to remove the hard drive from the carrier. Technicians may also need to quickly identify the correct hard drives within a rack. This may become a tedious process when multiple hard drives need servicing. Furthermore, some data centers may use automated machines and robots to perform basic services, including installing and removing hard drives. The machines and robots may need to accurately identify hard drives and carry and use the correct tools for swapping them. For these data centers, the complexity of the process may prove to be a challenging hurdle for automation. Therefore, data centers may need improved methods to secure hard drives in racks.

SUMMARY

As will be described in greater detail below, the instant disclosure describes various apparatuses, systems, and methods for securing hard drives in a storage chassis by locking the hard drives in the chassis with an ergonomic latch that enables easy scanning of hard drive labels. In one example, a drive latch apparatus may include a latch coupled to a chassis such that the latch secures a hard drive to the chassis. The drive latch apparatus may also include a handle coupled to a proximal end of the latch such that compressing the handle unlocks the latch from the chassis. Additionally, the drive latch apparatus may include a drive holder coupled to a distal end of the latch such that a distal end of the drive holder bends under the hard drive to unseat the hard drive and the drive holder slides vertically from the chassis in tandem with the latch. In some examples, the latch may contain a window dimensioned to display a label of the hard drive.

In some embodiments, the handle may include a groove dimensioned to fit a ledge of the chassis such that the handle locks the latch. Additionally, the handle may include a sloping surface facing the chassis such that a downward pressure forces the groove to fit around the ledge of the chassis. In these embodiments, the handle may be coupled to a spring such that the spring exerts a force between the handle and the latch and compressing the handle compresses the spring.

In some examples, the distal end of the latch may be coupled to a hinge such that the latch rotates relative to the drive holder. In one example, the drive holder may be coupled to the chassis by one or more protrusions such that the drive holder slides vertically along the chassis.

In one embodiment, the drive holder may include a length of spring steel and a bend in the length of spring steel that exerts an upward force on the drive holder to unseat the hard drive as the latch is unlocked. In some embodiments, the distal end of the drive holder may exert an upward force on the hard drive as the drive holder slides upward from the chassis such that the hard drive slides in tandem with the drive holder.

According to various embodiments, a corresponding hard drive rack system may include a rack dimensioned to hold computer hardware. The hard drive rack system may also include one or more chassis coupled to the rack that contains a plurality of drive slots dimensioned to hold one or more hard drives. Furthermore, the hard drive rack system may include one or more drive latches dimensioned to secure the hard drives in the drive slots. In one embodiment, a chassis may be dimensioned to slide perpendicular to a face of the rack such that the chassis extends away from the rack to expose the plurality of drive slots.

In one example, a drive latch may include a window dimensioned to display a label of a hard drive, a handle dimensioned to unlock the drive latch from the chassis as the handle is compressed, a spring dimensioned to exert a force on the handle to a locked position, and a drive holder that includes a length of spring steel and a bend in the length of spring steel that exerts an upward force on the drive holder as the drive latch is unlocked. In this example, the handle of the drive latch may also include a groove dimensioned to fit a ledge of the chassis such that the handle locks the drive latch and a sloping surface facing the chassis such that a downward pressure forces the groove to fit around the ledge of the chassis. In some embodiments, a distal end of the drive holder may bend under the hard drive to unseat the hard drive as the drive latch is unlocked.

In one embodiment, the drive holder of the above system may be coupled to the chassis by one or more protrusions such that the drive latch slides vertically along the chassis. In this embodiment, the drive latch may slide vertically along the chassis such that the hard drive slides in tandem with the drive latch.

In addition to the various systems and apparatuses described herein, the instant disclosure presents exemplary methods for securing hard drives in a storage chassis. For example, a corresponding method may include coupling a latch to a chassis such that the latch secures a hard drive to the chassis. The method may also include coupling a handle to a proximal end of the latch such that compressing the handle unlocks the latch from the chassis. In addition, the method may include coupling a drive holder to a distal end of the latch such that a distal end of the drive holder bends under the hard drive to unseat the hard drive and the drive holder slides vertically from the chassis in tandem with the latch.

In some examples, coupling the handle to the proximal end of the latch may include coupling a spring to the handle such that the spring exerts a force between the handle and the latch. Additionally, coupling the handle to the proximal end of the latch may include coupling the spring to the handle such that compressing the handle compresses the spring.

In some embodiments, the handle of the above method may include a groove dimensioned to fit a ledge of the chassis such that the handle locks the latch. Additionally, the handle of the above method may also include a sloping surface facing the chassis such that a downward pressure forces the groove to fit around the ledge of the chassis.

In one example, coupling the drive holder to the distal end of the latch may include coupling a hinge to the distal end of the latch such that the latch rotates relative to the drive holder. In one embodiment, the above method may further include coupling the drive holder to the chassis such that the drive holder slides vertically along the chassis and the distal end of the drive holder exerts an upward force on the hard drive as the drive holder slides upward from the chassis.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
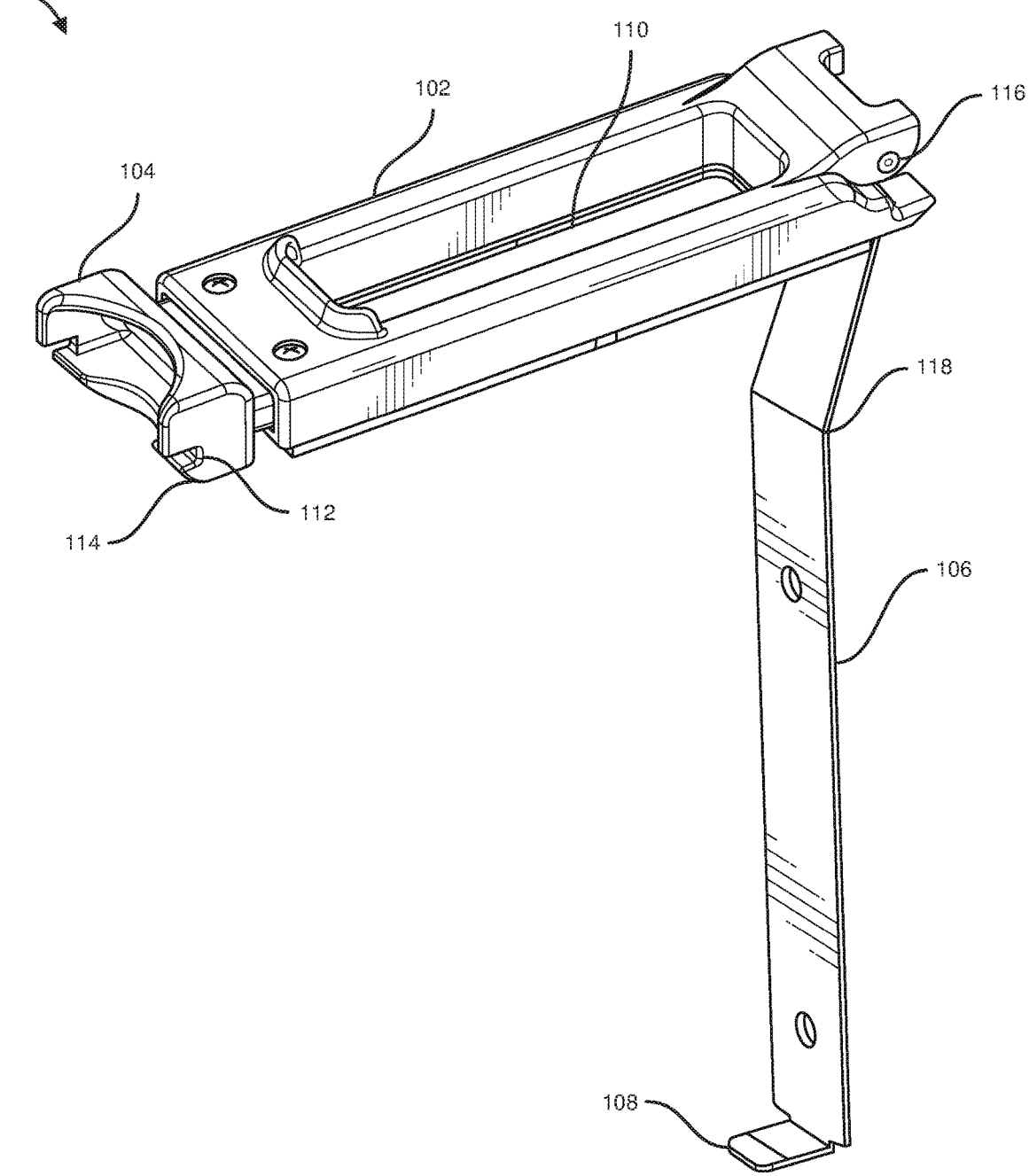
FIG. 1 is a perspective view of a drive latch apparatus dimensioned to secure hard drives in a closed position.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes and illustrates various apparatuses, systems, and methods for securing hard drives in a storage chassis. As will be explained in greater detail below, embodiments of the instant disclosure may improve the installation, removal, and/or selection of hard drives via an ergonomic latch. The latch may improve installation and/or removal of hard drives with a simple motion. For example, a spring steel drive holder may automatically unseat a hard drive when the latch is opened. The latch may also include a window for displaying a hard drive label to enable scanning. Additionally, such a system may be implemented in a chassis that is fitted for data-center racks. Thus, the embodiments described herein may provide carrier-less and tool-less swapping of hard drives.

Figure 2:
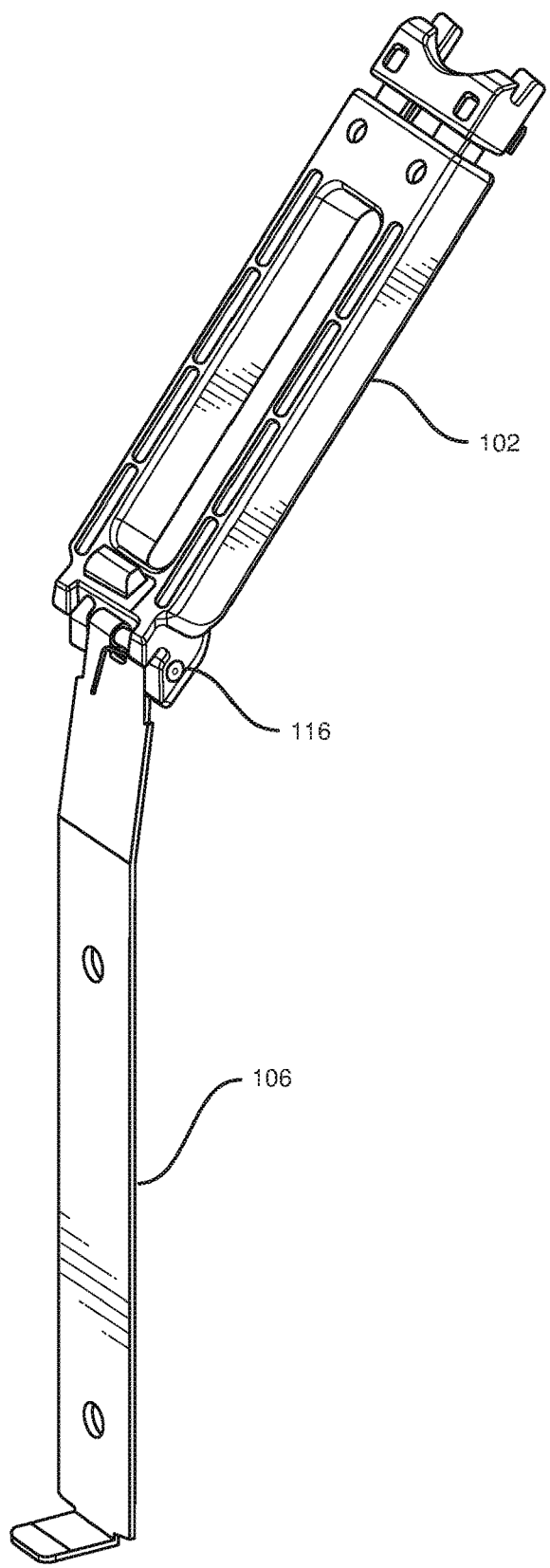
FIG. 2 is a perspective view of a drive latch apparatus in an open position.
Figure 3:
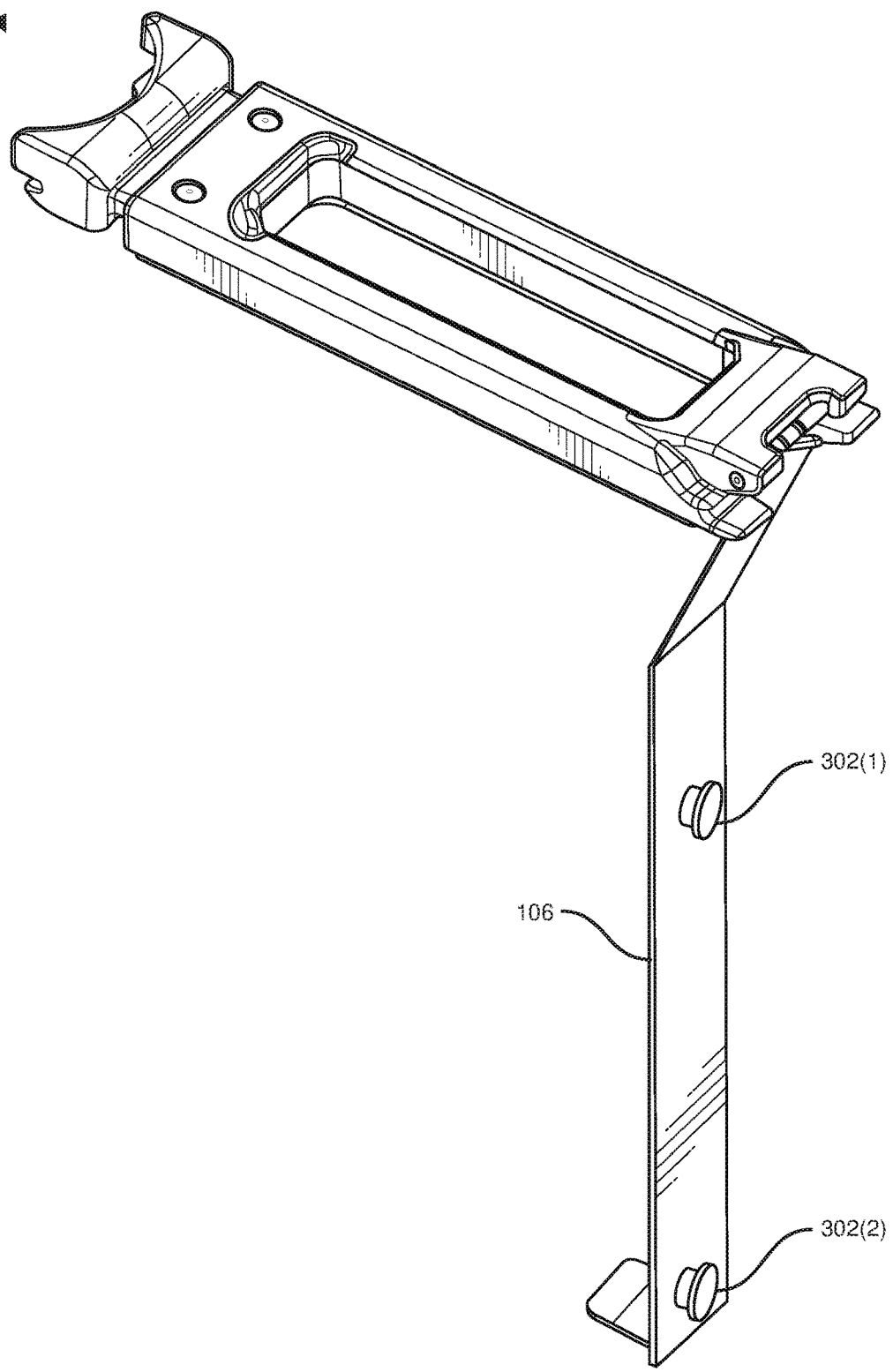
FIG. 3 is an additional perspective view of the drive latch apparatus in a closed position.

The following will provide, with reference to FIGS. 1-3, detailed descriptions of a drive latch apparatus that secures hard drives. In addition, the discussion associated with FIG. 4 will provide detailed descriptions of a handle used to lock and unlock the drive latch apparatus. The discussion associated with FIGS. 5-6 will provide examples of a chassis that holds hard drives using drive latches. Additionally, the discussion associated with FIG. 7 will provide an example of a hard drive rack system that implements the drive latch apparatuses. Finally, the discussion corresponding to FIG. 8 will provide example methods for manufacturing, assembling, configuring, and/or using the drive latch apparatuses presented herein.

FIG. 1 illustrates a perspective view of a drive latch apparatus 100 dimensioned to secure hard drives in a closed position. In some examples, drive latch apparatus 100 may include a latch 102 coupled to a chassis such that latch 102 secures a hard drive to the chassis. As used herein, the term "hard drive" generally refers to a hardware medium that stores and/or processes data, typically using magnetic storage methods. The term "chassis," as used herein, generally refers to a base structure or framework that fits into a rack, such as in a drawer-like fashion, to house or support computing equipment. The term "rack," as used herein, generally refers to a physical framework designed to house electronic and/or computing equipment, such as servers and/or storage media.

In the above examples, drive latch apparatus 100 may also include a handle 104 coupled to a proximal end of latch 102 such that compressing handle 104 unlocks latch 102 from the chassis. Drive latch apparatus 100 may further include a drive holder 106 coupled to a distal end of latch 102 such that a distal end 108 of drive holder 106 bends under the hard drive to unseat the hard drive and drive holder 106 slides vertically from the chassis in tandem with latch 102.

In one embodiment, latch 102 may contain a window 110 dimensioned to display a label of the hard drive. In this embodiment, window 110 may represent an open portion of latch 102 or a transparent (e.g., transparent or semi-transparent plastic or glass) portion of latch 102 that permits viewing the label. Furthermore, window 110 may permit manual reading and/or automated scanning of the label.

In one example, handle 104 may include a groove 112 dimensioned to fit a ledge of the chassis such that handle 104 locks latch 102 and, therefore, locks drive latch apparatus 100. Additionally, handle 104 may include a sloping surface 114 facing downward toward the chassis such that a downward pressure forces groove 112 to fit around the ledge of the chassis.

In some embodiments, the distal end of latch 102 may be coupled to a hinge 116 such that latch 102 rotates relative to drive holder 106. In one example, drive holder 106 may include a length of spring steel (or a length of any other suitable resilient material) and a bend 118 in the length of spring steel. As used herein, the term "spring steel" refers to a steel-compound material with a high yield strength that may return to an original shape after bending and/or distorting. The spring steel material may provide a tension to force drive holder 106 upward. In this example, latch 102 may prevent the upward tension of drive holder 106 from unseating the hard drive. The length of spring steel (or other material) may be dimensioned with any suitable height, length, and/or thickness.

FIG. 2 illustrates a perspective view of drive latch apparatus 100 in an open position. In one embodiment, the distal end of latch 102 may be coupled to hinge 116 such that latch 102 rotates to the open position relative to drive holder 106. In this embodiment, drive holder 106 may remain in the chassis while latch 102 rotates around hinge 116 to open and/or close.

FIG. 3 illustrates an additional perspective view of drive latch apparatus 100 in a closed position. In some examples, drive holder 106 may be coupled to the chassis by one or more protrusions, such as protrusions 302(1) and 302(2). In these examples, protrusions 302(1) and 302(2) may permit drive latch apparatus 100 to be easily fitted into or removed from the chassis by sliding into vertical slots of the chassis. Protrusions 302(1) and 302(2) may also permit drive latch apparatus 100 to slide within the chassis.

Figure 4:
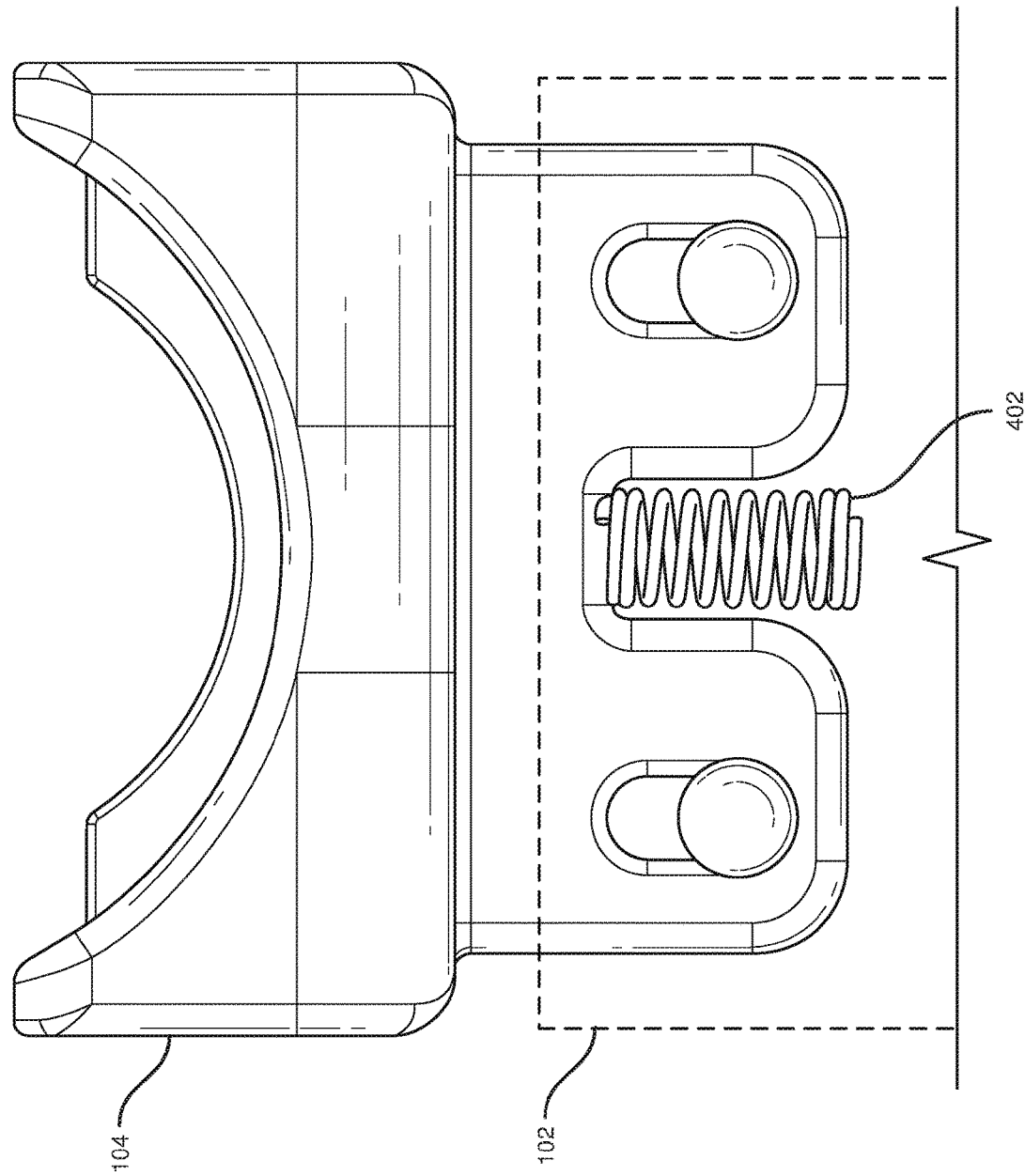
FIG. 4 is a top view of a handle for unlocking a drive latch apparatus.

FIG. 4 illustrates a top view of handle 104 for unlocking drive latch apparatus 100. In one example, handle 104 may be coupled to a spring 402 such that spring 402 exerts a force between handle 104 and latch 102. In this example, spring 402 may be dimensioned to fit inside a compartment of latch 102 and exert the force on handle 104 to bias the latch to a locked position. Additionally, compressing handle 104, when actuated, may compress spring 402, which may force handle 104 to an unlocked position. For example, handle 104 and latch 102 may be pinched together to compress spring 402. Furthermore, handle 104 may be designed in an ergonomic way for ease of handling by humans or machines.

Figure 5:
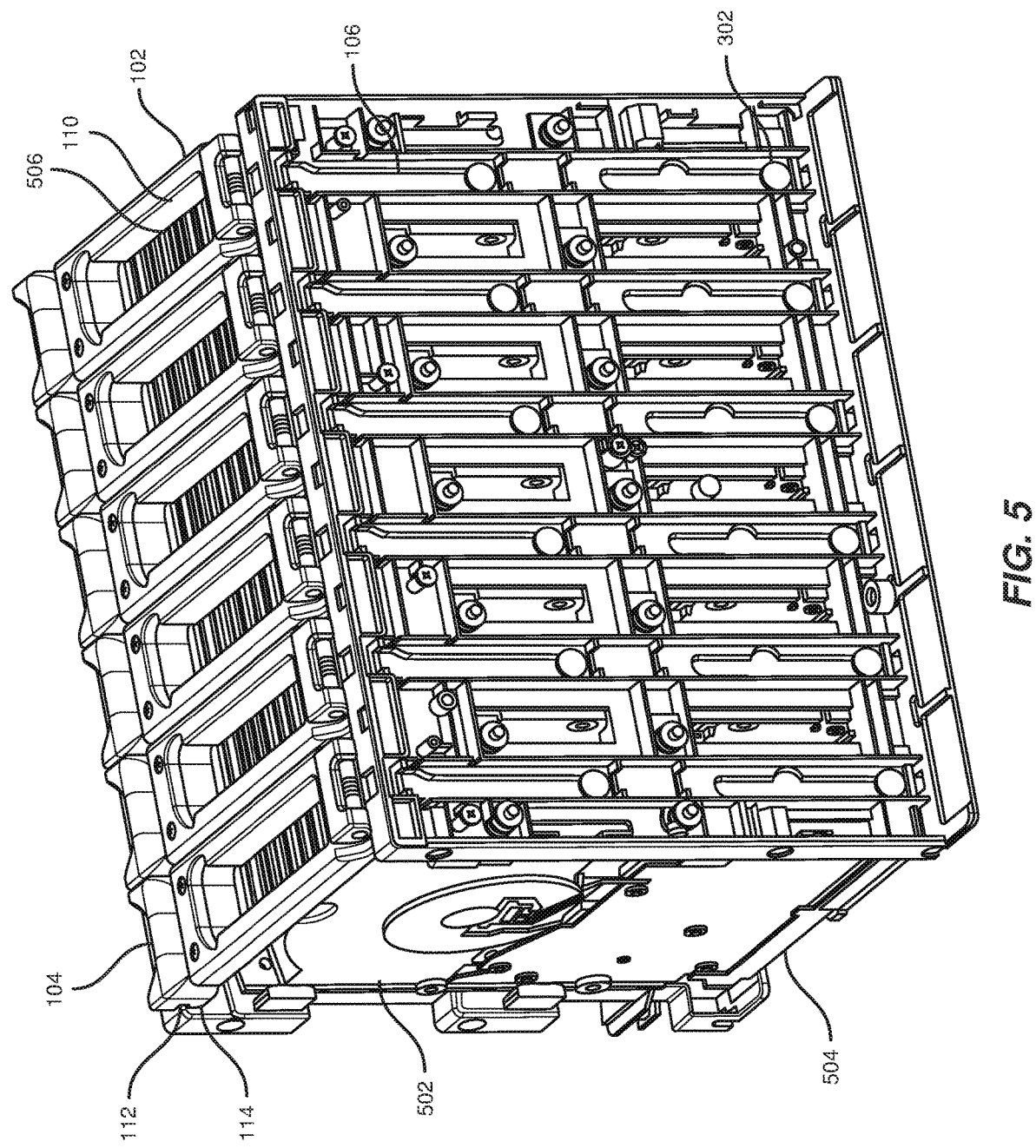
FIG. 5 is a perspective view of a chassis housing hard drives secured by drive latches.

FIG. 5 illustrates a perspective view of a chassis 504 housing hard drives, such as a hard drive 502, secured by drive latches. In this example, chassis 504 may contain multiple hard drives secured by multiple drive latches. In other examples, chassis 504 may contain a single hard drive and/or other types of computing hardware. In these examples, drive latch apparatus 100 may be dimensioned to secure these additional types of computing hardware in a similar manner.

In one embodiment, latch 102 may be coupled to chassis 504 such that latch 102 secures a hard drive, such as hard drive 502, to chassis 504. Latch 102 may also contain window 110 dimensioned to display a label 506 of the hard drive. In this embodiment, label 506 may include a barcode suitable for automated scanning through window 110. In one example, each hard drive in chassis 504 may include a different label and be uniquely identified by the label. In another example, label 506 may identify a type or model of hard drive. Additionally or alternatively, label 506 may include textual information that may be read by a technician or administrator of the hard drives.

In some examples, handle 104 may include groove 112 dimensioned to fit a ledge of chassis 504 such that handle 104 locks latch 102 to chassis 504. In these examples, sloping surface 114 may face chassis 504 such that a downward pressure forces groove 112 to fit around the ledge of chassis 504. For example, to install hard drive 502, a technician may press hard drive 502 downward into a slot in chassis 504 and secure hard drive 502 by pushing handle 104 downward until sloping surface 114 slides past the ledge of chassis 504 so that groove 112 fits around the ledge.

In some embodiments, drive holder 106 may be coupled to chassis 504 by one or more protrusions, such as a protrusion 302. In these embodiments, as shown in FIG. 5, protrusion 302 may fit into chassis 504 through a tailored hole in chassis 504 and then slide along a vertical slot of chassis 504. Similarly, drive holder 106 and drive latch apparatus 100 may be removed from chassis 504 by removing protrusion 302 through the tailored hole. In these embodiments, protrusion 302 may be dimensioned to remain coupled to chassis 504 unless intentionally removed.

Figure 6:
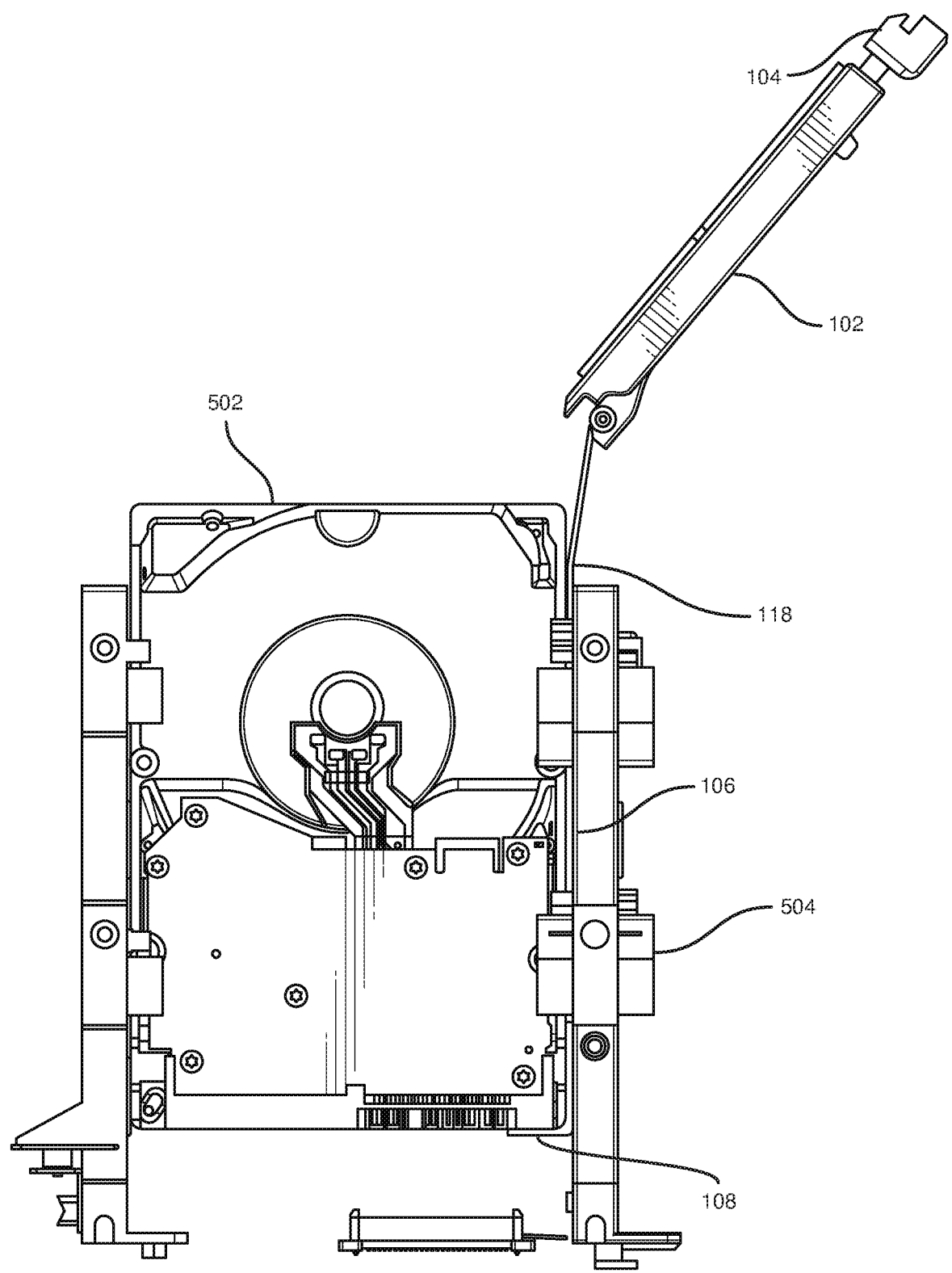
FIG. 6 is a side view of a hard drive unseated by an unlocked drive latch in a chassis.

FIG. 6 illustrates a side view of hard drive 502 unseated by unlocked drive latch apparatus 100 in chassis 504. In some examples, handle 104 may be coupled to a proximal end of latch 102 and dimensioned to unlock drive latch apparatus 100 from chassis 504 as handle 104 is compressed. In these examples, distal end 108 of drive holder 106 may bend under hard drive 502 to unseat hard drive 502 as latch 102 is opened. Furthermore, drive holder 106 may slide vertically from chassis 504 in tandem with latch 102. For example, drive holder 106 may slide vertically along a slot via protrusion 302 of FIG. 5. As latch 102 is lifted from chassis 504, such as for removal of hard drive 502, drive holder 106 may also lift. In other words, distal end 108 of drive holder 106 may bend under hard drive 502 to unseat hard drive 502 as drive latch apparatus 100 is unlocked.

In one embodiment, drive holder 106 may include bend 118 that exerts an upward force on drive holder 106 to unseat hard drive 502 as latch 102 is unlocked. Due to bend 118 straightening as latch 102 locks, drive holder 106 continually exerts an upward force as bend 118 attempts to return to a natural shape. In this embodiment, spring steel drive holder 106 exerts the upward force to return bend 118 to its unloaded, natural shape when latch 102 is unlocked. Drive holder 106 may be dimensioned to slowly lift upward to reduce damage to hard drive 502 during the unseating process. Additionally, bend 118 may prevent drive holder 106 from sliding down after latch 102 is unlocked, thus keeping hard drive 502 in a raised position. In this embodiment, additional computing hardware and components may be installed or removed without completely removing hard drives from chassis 504. For example, hard drive 502 may be installed to pair with a mounting board, and the mounting board may be separately replaced while drive holder 106 elevates hard drive 502 within chassis 504. Alternatively, chassis 504 may be removed with the hard drives such that other components of a rack are not disturbed.

In some examples, distal end 108 of drive holder 106 may exert an upward force on hard drive 502 as drive holder 106 slides upward from chassis 504 such that hard drive 502 slides in tandem with drive holder 106. In these examples, distal end 108 of drive holder 106 may remain under hard drive 502 as hard drive 502 is installed in chassis 504 and may push distal end 108 of drive holder 106 down. Additionally, drive latch apparatus 100 may slide vertically along chassis 504 such that hard drive 502 slides in tandem with drive latch apparatus 100. For example, pulling latch 102 upward may result in drive holder 106 of drive latch apparatus 100 moving upward and forcing hard drive 502 upward from chassis 504. In this example, elevating hard drive 502 may enable easier removal or replacement of hard drive 502.

Figure 7:
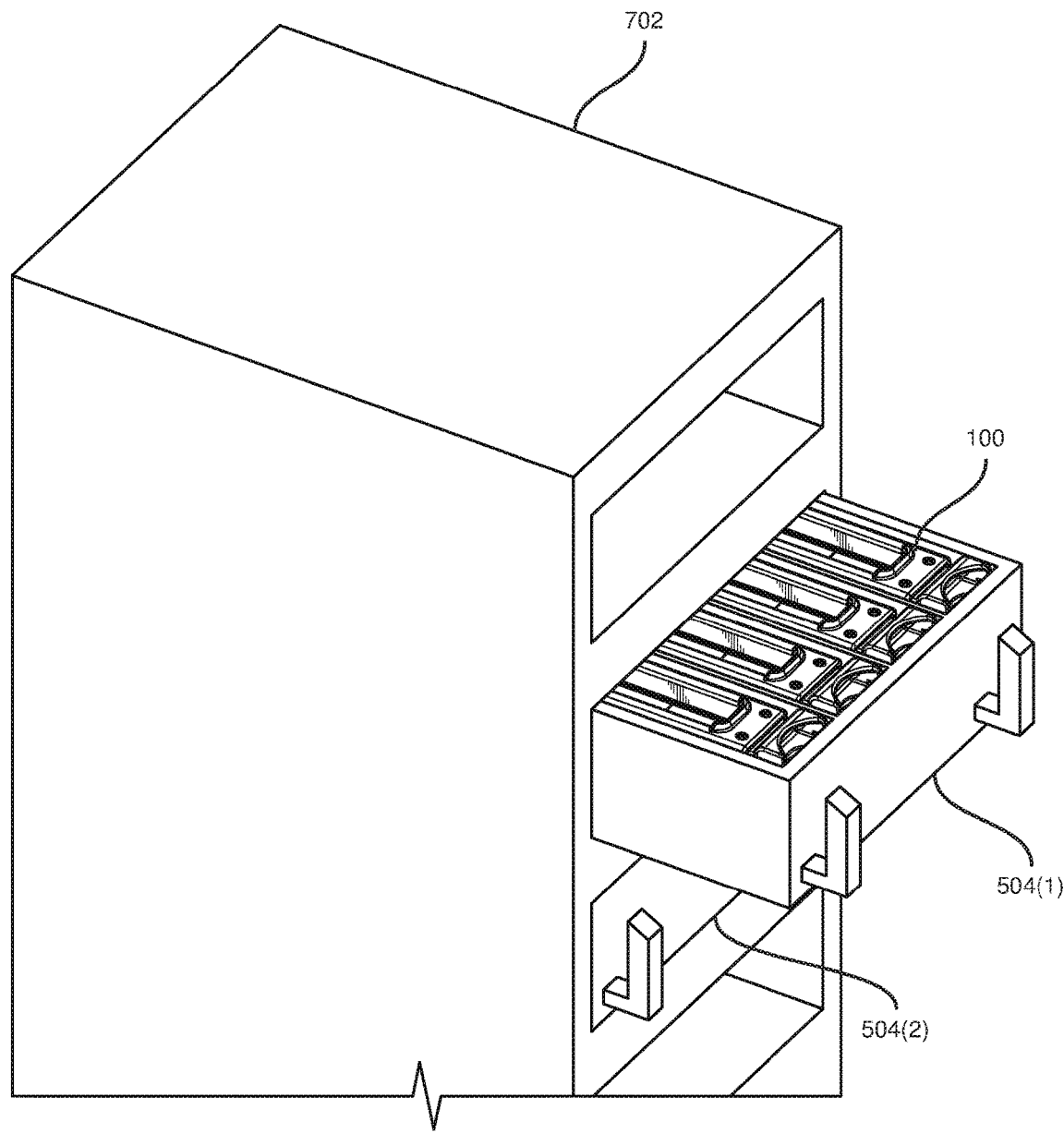
FIG. 7 is a perspective view of a hard drive rack system for securing multiple hard drives with drive latches.

FIG. 7 illustrates a perspective view of a hard drive rack system 700 for securing multiple hard drives with drive latches. In one embodiment, hard drive rack system 700 may include a rack 702 dimensioned to hold computer hardware. In this embodiment, a chassis 504(1) and a chassis 504(2) may be coupled to rack 702 and may contain a plurality of drive slots dimensioned to hold one or more hard drives. Additionally, one or more drive latches, such as drive latch apparatus 100 in chassis 504(1), may be dimensioned to secure the hard drives in drive slots.

In some embodiments, chassis 504(1) and/or chassis 504(2) may be dimensioned to slide perpendicular to a face of rack 702 such that chassis 504(1) and/or chassis 504(2) extend away from rack 702 to expose the plurality of drive slots. In the example of FIG. 7, chassis 504(1) may extend horizontally from rack 702 to expose multiple drive latches, including drive latch apparatus 100.

Figure 8:
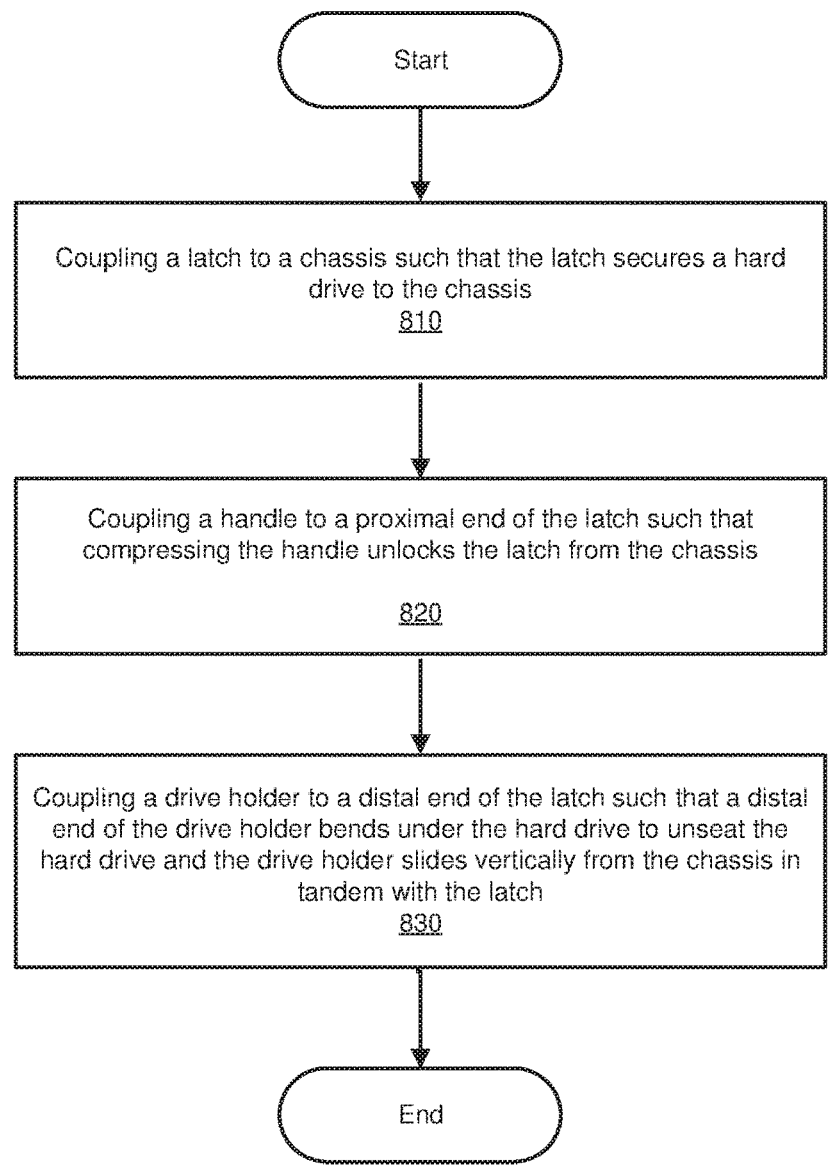
FIG. 8 is a flow diagram of an exemplary method for securing hard drives in a storage chassis.

FIG. 8 shows an example method for manufacturing, assembling, using, adjusting, or otherwise configuring or creating the systems and apparatuses presented herein. The steps shown in FIG. 8 may be performed by any individual and/or by any suitable type or form of manual and/or automated apparatus. In particular, FIG. 8 illustrates a flow diagram of an exemplary method 800 for assembling a drive latch apparatus.

As shown in FIG. 8, at step 810, a latch may be coupled to a chassis such that the latch secures a hard drive to the chassis. For example, as shown in FIG. 6, latch 102 may be coupled to chassis 504 such that latch 102 secures hard drive 502 to chassis 504.

At step 820, a handle may be coupled to a proximal end of the latch such that compressing the handle unlocks the latch from the chassis. For example, as illustrated in FIG. 1, handle 104 may be coupled to the proximal end of latch 102. Compressing handle 104 may unlock latch 102 to swing away from chassis 504, as shown in FIG. 6. In this example, compressing handle 104 may push groove 112 of FIG. 5 away from the ledge of chassis 504, and swinging latch 102 upward may unlock drive latch apparatus 100.

In some embodiments, coupling handle 104 to the proximal end of latch 102 may include coupling spring 402, as shown in FIG. 4, to handle 104 such that spring 402 exerts a force between handle 104 and latch 102. In these embodiments, compressing handle 104 may then compress spring 402. In an additional embodiment, handle 104 may be dimensioned to include groove 112, as shown in FIG. 5, that fits a ledge of chassis 504 such that handle 104 locks latch 102. In this embodiment, handle 104 may also be dimensioned to include sloping surface 114 that faces chassis 504 such that a downward pressure forces groove 112 to fit around the ledge of chassis 504.

At step 830, a drive holder may be coupled to a distal end of the latch such that a distal end of the drive holder bends under the hard drive to unseat the hard drive and such that the drive holder slides vertically from the chassis in tandem with the latch. For example, as illustrated in FIG. 6, drive holder 106 may be coupled to the distal end of latch 102 such that distal end 108 of drive holder 106 bends under hard drive 502 to unseat hard drive 502. In this example, drive holder 106 may also be dimensioned to vertically slide from chassis 504 in tandem with latch 102.

In one embodiment, coupling drive holder 106 to the distal end of latch 102 may include coupling hinge 116, as shown in FIG. 2, to the distal end of latch 102 such that latch 102 rotates relative to drive holder 106. In this embodiment, hinge 116 may facilitate easy movement of latch 102 to open and/or close.

In some examples, method 800 may further include a step in which the drive holder may be coupled to the chassis such that the drive holder slides vertically along the chassis and the distal end of the drive holder exerts an upward force on the hard drive as the drive holder slides upward from the chassis. In the example of FIG. 6, drive holder 106 may be coupled to chassis 504 to vertically slide along chassis 504 as latch 102 opens and/or closes. In this example, distal end 108 of drive holder 106 may exert the upward force on hard drive 502 as latch 102 opens and drive holder 106 slides upward from chassis 504.

As discussed throughout the instant disclosure, the disclosed methods, systems, and apparatuses may provide one or more advantages over traditional methods of securing hard drives in racks. For example, the drive latch apparatuses described herein may utilize ergonomic handles for easy opening and closing of the drive latches. As another example, by securing hard drives in slots in a chassis, the systems described herein may hold the hard drives in place regardless of other computing components. Additionally, the disclosed drive holder of the drive latch apparatus may automatically unseat a hard drive when a latch is opened due to the bend in the spring steel of the drive holder. Furthermore, the drive latch apparatuses described herein may include a window to facilitate scanning or reading of hard drive labels for easy identification. Thus, the mechanisms disclosed herein may enable carrier-less and tool-less hard drive storage.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A drive latch apparatus comprising:
   a latch coupled to a chassis such that the latch secures a hard drive to the chassis;
   a handle coupled to a proximal end of the latch such that compressing the handle unlocks the latch from the chassis, wherein the handle is dimensioned to be positioned over the hard drive when the hard drive is secured to the chassis; and
   a drive holder coupled to a distal end of the latch such that:
      the latch rotates relative to the drive holder to unlock the latch;
      the drive holder exerts a continuous upward force to return to an original shape of the drive holder while the latch is locked;
      a distal end of the drive holder bends under the hard drive to automatically unseat the hard drive as the continuous upward force vertically slides the drive holder from the chassis when the latch is unlocked; and
      the drive holder slides vertically from the chassis in tandem with the latch;

wherein the handle is coupled to a spring such that:
the spring exerts a force between the handle and the latch; and
compressing the handle compresses the spring.

2. The drive latch apparatus of claim 1, wherein the latch contains a window dimensioned to display a label of the hard drive.

3. The drive latch apparatus of claim 1, wherein the handle comprises:
a groove dimensioned to fit a ledge of the chassis such that the handle locks the latch; and
a sloping surface facing the chassis such that a downward pressure forces the groove to fit around the ledge of the chassis.

4. The drive latch apparatus of claim 1, wherein the drive holder exerts the continuous upward force to return to an unloaded bent shape of the drive holder while the latch is locked.

5. The drive latch apparatus of claim 1, wherein the distal end of the latch is coupled to a hinge such that the latch rotates around the hinge relative to the drive holder.

6. The drive latch apparatus of claim 1, wherein the drive holder is coupled to the chassis by at least one protrusion such that the drive holder slides vertically along the chassis.

7. The drive latch apparatus of claim 1, wherein the drive holder comprises:
a length of spring steel; and
a bend in the length of spring steel that exerts the continuous upward force on the drive holder to unseat the hard drive as the latch is unlocked.

8. The drive latch apparatus of claim 1, wherein the distal end of the drive holder exerts an upward force on the hard drive as the drive holder slides upward from the chassis such that the hard drive slides in tandem with the drive holder.

9. A hard drive rack system comprising:
a rack dimensioned to hold computer hardware;
at least one chassis coupled to the rack that contains a plurality of drive slots dimensioned to hold at least one hard drive; and
at least one drive latch dimensioned to secure the hard drive in a drive slot, the drive latch comprising:
a handle dimensioned to unlock the drive latch from the chassis as the handle is compressed, wherein the handle is dimensioned to be positioned over the hard drive when the hard drive is secured to the chassis; and
a drive holder comprising:
a length of resilient material; and
a bend in the length of resilient material that exerts an upward force on the drive holder to return to an unloaded bent shape of the drive holder as the drive latch is unlocked;
wherein the handle is coupled to a spring such that:
the spring exerts a force between the handle and the latch; and
compressing the handle compresses the spring.

10. The hard drive rack system of claim 9, wherein the chassis is dimensioned to slide perpendicular to a face of the rack such that the chassis extends away from the rack to expose the plurality of drive slots.

11. The hard drive rack system of claim 9, wherein the drive latch comprises:
a window dimensioned to display a label of the hard drive.

12. The hard drive rack system of claim 9, wherein the handle comprises:
a groove dimensioned to fit a ledge of the chassis such that the handle locks the drive latch; and
a sloping surface facing the chassis such that a downward pressure forces the groove to fit around the ledge of the chassis.

13. The hard drive rack system of claim 9, wherein a distal end of the drive holder bends under the hard drive to automatically unseat the hard drive as the drive latch is unlocked.

14. The hard drive rack system of claim 9, wherein the drive holder is coupled to the chassis by at least one protrusion such that the drive latch slides vertically along the chassis.

15. The hard drive rack system of claim 14, wherein the drive latch slides vertically along the chassis such that the hard drive slides in tandem with the drive latch.

* * * * *